US009182429B2

(12) United States Patent
Saxby et al.

(10) Patent No.: US 9,182,429 B2
(45) Date of Patent: Nov. 10, 2015

(54) DISTRIBUTION LINE CLAMP FORCE USING DC BIAS ON COIL

(71) Applicant: Sentient Energy, Inc., Burlingame, CA (US)

(72) Inventors: Dennis Saxby, Los Gatos, CA (US); Mark A. Parsons, Colorado Springs, CO (US); James McKeffery, Milpitas, CA (US)

(73) Assignee: SENTIENT ENERGY, INC., Burlingame, CA (US)

( * ) Notice: Subject to any disclaimer, the term of this patent is extended or adjusted under 35 U.S.C. 154(b) by 119 days.

(21) Appl. No.: 13/734,813

(22) Filed: Jan. 4, 2013

(65) Prior Publication Data
US 2013/0187637 A1    Jul. 25, 2013

Related U.S. Application Data

(60) Provisional application No. 61/583,117, filed on Jan. 4, 2012.

(51) Int. Cl.
*G01R 15/18* (2006.01)
*G01R 21/00* (2006.01)
(Continued)

(52) U.S. Cl.
CPC *G01R 21/00* (2013.01); *G01R 1/22* (2013.01); *G01R 15/142* (2013.01); *H02J 5/005* (2013.01); *G01R 15/18* (2013.01)

(58) Field of Classification Search
CPC ...... G01R 15/14; G01R 15/186; G01R 19/15; H02J 5/005; H01F 21/08
USPC .................................................. 324/126, 127
See application file for complete search history.

(56) References Cited

U.S. PATENT DOCUMENTS 3,558,984 A    1/1971    Smith et al.
3,676,740 A    7/1972    Schweitzer, Jr.
(Continued)

FOREIGN PATENT DOCUMENTS

CN    203800581 U  *  8/2014
EP    1508146 A        2/2005
(Continued)

OTHER PUBLICATIONS

Stringfield et al.; Fault location methods for overhead lines; in Transactions of the American Institute of Electrical Engineers; Amer. Inst. of Electrical Eng.; New York, NY; Part. III; vol. 76; pp. 518-530; Aug. 1957.
Saha et al.; Fault Location on Power Networks (Power Systems); Springer Verlag; London, UK; 435 pgs.; 2010 (Preface: Oct. 2009).

*Primary Examiner* — Patrick Assouad
*Assistant Examiner* — Sean Curtis
(74) *Attorney, Agent, or Firm* — Shay Glenn LLP

(57) ABSTRACT

A power distribution monitoring system is provided that can include a number of features. The system can include a plurality of monitoring devices configured to attach to individual conductors on a power grid distribution network. In some embodiments, a monitoring device is disposed on each conductor of a three-phase network and utilizes a split-core transformer to harvest energy from the conductors. The monitoring devices can be configured to harvest energy from the AC power grid and apply a DC bias to core halves of the split-core transformer to maintain a positive magnetic force between the core halves. Methods of installing and using the monitoring devices are also provided.

14 Claims, 7 Drawing Sheets

(51) Int. Cl.
  *G01R 1/22* (2006.01)
  *G01R 15/14* (2006.01)
  *H02J 5/00* (2006.01)

(56) References Cited

U.S. PATENT DOCUMENTS

| | | | |
|---|---|---|---|
| 3,686,531 A | 8/1972 | Decker et al. | |
| 3,702,966 A | 11/1972 | Schweitzer, Jr. | |
| 3,708,724 A | 1/1973 | Schweitzer, Jr. | |
| 3,715,742 A | 2/1973 | Schweitzer, Jr. | |
| 3,720,872 A | 3/1973 | Russell et al. | |
| 3,725,832 A | 4/1973 | Schweitzer, Jr. | |
| 3,755,714 A | 8/1973 | Link | |
| 3,768,011 A * | 10/1973 | Swain | 324/117 R |
| 3,777,217 A | 12/1973 | Groce et al. | |
| 3,816,816 A * | 6/1974 | Schweitzer, Jr. | 324/133 |
| 3,866,197 A | 2/1975 | Schweitzer, Jr. | |
| 3,876,911 A | 4/1975 | Schweitzer, Jr. | |
| 3,957,329 A | 5/1976 | McConnell | |
| 3,970,898 A | 7/1976 | Baumann et al. | |
| 4,063,161 A | 12/1977 | Pardis | |
| 4,152,643 A | 5/1979 | Schweitzer, Jr. | |
| 4,339,792 A * | 7/1982 | Yasumura et al. | 363/75 |
| 4,378,525 A * | 3/1983 | Burdick | 324/127 |
| 4,408,155 A | 10/1983 | McBride | |
| 4,466,071 A | 8/1984 | Russell, Jr. | |
| 4,559,491 A | 12/1985 | Saha | |
| 4,570,231 A | 2/1986 | Bunch | |
| 4,584,523 A | 4/1986 | Elabd | |
| 4,709,339 A | 11/1987 | Fernandes | |
| 4,714,893 A | 12/1987 | Smith Vaniz et al. | |
| 4,723,220 A | 2/1988 | Smith Vaniz | |
| 4,728,887 A * | 3/1988 | Davis | 324/127 |
| 4,746,241 A | 5/1988 | Burbank | |
| 4,766,549 A | 8/1988 | Schweitzer, III et al. | |
| 4,775,839 A | 10/1988 | Kosina et al. | |
| 4,806,855 A * | 2/1989 | Davis | 324/127 |
| 4,808,916 A * | 2/1989 | Smith-Vaniz | 324/110 |
| 4,829,298 A | 5/1989 | Fernandes | |
| 4,881,028 A | 11/1989 | Bright | |
| 4,886,980 A | 12/1989 | Fernandes et al. | |
| 4,904,932 A | 2/1990 | Schweitzer, Jr. | |
| 4,937,769 A | 6/1990 | Verbanets | |
| 5,006,846 A | 4/1991 | Granville et al. | |
| 5,125,738 A | 6/1992 | Kawamura et al. | |
| 5,138,265 A | 8/1992 | Kawamura et al. | |
| 5,140,257 A * | 8/1992 | Davis | 324/106 |
| 5,159,561 A | 10/1992 | Watanabe et al. | |
| 5,181,026 A | 1/1993 | Granville | |
| 5,182,547 A * | 1/1993 | Griffith | 340/664 |
| 5,202,812 A | 4/1993 | Shinoda et al. | |
| 5,206,595 A | 4/1993 | Wiggins et al. | |
| 5,220,311 A | 6/1993 | Schweitzer, Jr. | |
| 5,341,088 A * | 8/1994 | Davis | 324/106 |
| 5,428,549 A | 6/1995 | Chen | |
| 5,438,256 A | 8/1995 | Thuries et al. | |
| 5,473,244 A * | 12/1995 | Libove et al. | 324/126 |
| 5,495,169 A * | 2/1996 | Smith | 324/127 |
| 5,550,476 A | 8/1996 | Lau et al. | |
| 5,565,783 A | 10/1996 | Lau et al. | |
| 5,600,248 A | 2/1997 | Westrom et al. | |
| 5,608,328 A | 3/1997 | Sanderson | |
| 5,650,728 A | 7/1997 | Rhein et al. | |
| 5,656,931 A | 8/1997 | Lau et al. | |
| 5,682,100 A | 10/1997 | Rossi et al. | |
| 5,696,788 A | 12/1997 | Choi et al. | |
| 5,712,796 A | 1/1998 | Ohura et al. | |
| 5,729,144 A | 3/1998 | Cummins | |
| 5,737,203 A * | 4/1998 | Barrett | 363/75 |
| 5,764,065 A | 6/1998 | Richards et al. | |
| 5,839,093 A | 11/1998 | Novosel et al. | |
| 5,892,430 A * | 4/1999 | Wiesman et al. | 340/538.16 |
| 5,990,674 A | 11/1999 | Schweitzer, Jr. | |
| 6,002,260 A | 12/1999 | Lau et al. | |
| 6,016,105 A | 1/2000 | Schweitzer, Jr. | |
| 6,043,433 A | 3/2000 | Schweitzer, Jr. | |
| 6,133,723 A | 10/2000 | Feight | |
| 6,133,724 A | 10/2000 | Schweitzer, Jr. et al. | |
| 6,288,632 B1 | 9/2001 | Hoctor et al. | |
| 6,292,340 B1 | 9/2001 | O'Regan et al. | |
| 6,347,027 B1 | 2/2002 | Nelson et al. | |
| 6,433,698 B1 | 8/2002 | Schweitzer, Jr. et al. | |
| 6,459,998 B1 | 10/2002 | Hoffman | |
| 6,466,030 B2 | 10/2002 | Hu et al. | |
| 6,466,031 B1 | 10/2002 | Hu et al. | |
| 6,477,475 B1 | 11/2002 | Takaoka et al. | |
| 6,483,435 B2 | 11/2002 | Saha et al. | |
| 6,549,880 B1 | 4/2003 | Willoughby et al. | |
| 6,559,651 B1 | 5/2003 | Crick | |
| 6,566,854 B1 * | 5/2003 | Hagmann et al. | 324/117 R |
| 6,577,108 B2 | 6/2003 | Hubert et al. | |
| 6,601,001 B1 | 7/2003 | Moore | |
| 6,622,285 B1 | 9/2003 | Rust et al. | |
| 6,677,743 B1 * | 1/2004 | Coolidge et al. | 324/126 |
| 6,718,271 B1 | 4/2004 | Tobin | |
| 6,734,662 B1 | 5/2004 | Fenske | |
| 6,798,211 B1 | 9/2004 | Rockwell et al. | |
| 6,822,457 B2 | 11/2004 | Borchert et al. | |
| 6,822,576 B1 | 11/2004 | Feight et al. | |
| 6,879,917 B2 | 4/2005 | Turner | |
| 6,894,478 B1 | 5/2005 | Fenske | |
| 6,914,763 B2 | 7/2005 | Reedy | |
| 6,917,888 B2 | 7/2005 | Logvinov et al. | |
| 6,927,672 B2 | 8/2005 | Zalitzky et al. | |
| 6,949,921 B1 | 9/2005 | Feight et al. | |
| 6,963,197 B1 | 11/2005 | Feight et al. | |
| 6,980,090 B2 | 12/2005 | Mollenkopf | |
| 7,023,691 B1 | 4/2006 | Feight et al. | |
| 7,046,124 B2 | 5/2006 | Cope et al. | |
| 7,053,601 B1 | 5/2006 | Fenske et al. | |
| 7,072,163 B2 | 7/2006 | McCollough, Jr. | |
| 7,076,378 B1 | 7/2006 | Huebner | |
| 7,085,659 B2 | 8/2006 | Peterson et al. | |
| 7,106,048 B1 | 9/2006 | Feight et al. | |
| 7,158,012 B2 * | 1/2007 | Wiesman et al. | 340/538.16 |
| 7,187,275 B2 | 3/2007 | McCollough, Jr. | |
| 7,203,622 B2 | 4/2007 | Pan et al. | |
| 7,272,516 B2 | 9/2007 | Wang et al. | |
| 7,295,133 B1 | 11/2007 | McCollough, Jr. | |
| 7,400,150 B2 | 7/2008 | Cannon | |
| 7,424,400 B2 | 9/2008 | McCormack et al. | |
| 7,449,991 B2 | 11/2008 | Mollenkopf | |
| 7,450,000 B2 | 11/2008 | Gidge et al. | |
| 7,508,638 B2 | 3/2009 | Hooper | |
| 7,518,529 B2 | 4/2009 | O'Sullivan et al. | |
| 7,532,012 B2 | 5/2009 | Cern | |
| 7,557,563 B2 * | 7/2009 | Gunn et al. | 324/127 |
| 7,626,794 B2 | 12/2009 | Swartzendruber et al. | |
| 7,633,262 B2 * | 12/2009 | Lindsey et al. | 320/108 |
| 7,672,812 B2 | 3/2010 | Stoupis et al. | |
| 7,683,798 B2 | 3/2010 | Rostron | |
| 7,701,356 B2 | 4/2010 | Curt et al. | |
| 7,714,592 B2 | 5/2010 | Radtke et al. | |
| 7,720,619 B2 | 5/2010 | Hou | |
| 7,725,295 B2 | 5/2010 | Stoupis et al. | |
| 7,742,393 B2 | 6/2010 | Bonicatto et al. | |
| 7,764,943 B2 | 7/2010 | Radtke | |
| 7,795,877 B2 | 9/2010 | Radtke et al. | |
| 7,795,994 B2 | 9/2010 | Radtke | |
| 7,804,280 B2 | 9/2010 | Deaver, Sr. et al. | |
| 7,930,141 B2 | 4/2011 | Banting | |
| 8,421,444 B2 * | 4/2013 | Gunn | 324/127 |
| 8,497,781 B2 * | 7/2013 | Engelhardt et al. | 340/870.01 |
| 8,594,956 B2 * | 11/2013 | Banting et al. | 702/64 |
| 2006/0202664 A1 * | 9/2006 | Lindsey et al. | 320/137 |
| 2006/0279910 A1 * | 12/2006 | Gunn et al. | 361/600 |
| 2008/0077336 A1 | 3/2008 | Fernandes | |
| 2009/0058582 A1 * | 3/2009 | Webb | 335/229 |
| 2009/0309754 A1 * | 12/2009 | Bou et al. | 340/870.02 |
| 2010/0084920 A1 * | 4/2010 | Banting et al. | 307/66 |
| 2010/0085036 A1 * | 4/2010 | Banting et al. | 324/127 |
| 2011/0032739 A1 * | 2/2011 | Juhlin | 363/127 |
| 2012/0039062 A1 | 2/2012 | McBee et al. | |
| 2012/0139554 A1 | 6/2012 | Parsons | |

(56) References Cited

U.S. PATENT DOCUMENTS

2013/0187636 A1\* 7/2013 Kast et al. .................... 324/127
2014/0145858 A1\* 5/2014 Miller et al. ............. 340/870.07
2014/0226366 A1\* 8/2014 Morokuma et al. ............ 363/15

FOREIGN PATENT DOCUMENTS

| EP | 1938159 A | 7/2008 |
|----|-----------|--------|
| EP | 2340592 A | 7/2011 |
| EP | 2350764 A | 8/2011 |

\* cited by examiner

DISTRIBUTION LINE CLAMP FORCE USING DC BIAS ON COIL

CROSS REFERENCE TO RELATED APPLICATIONS

This application claims the benefit under 35 U.S.C. 119 of U.S. Provisional Patent Application No. 61/583,117, filed Jan. 4, 2012, titled "Distribution Line Clamp Force Using DC Bias on Coil", which application is incorporated by reference as if fully set forth herein.

INCORPORATION BY REFERENCE

All publications and patent applications mentioned in this specification are herein incorporated by reference to the same extent as if each individual publication or patent application was specifically and individually indicated to be incorporated by reference.

FIELD

The present application relates generally to distribution line monitoring, sensor monitoring, and power harvesting.

BACKGROUND

Power harvesting using induction pick-up from the magnetic field surrounding a power distribution line can be used to power distribution line monitoring sensors. Typically, the power line is routed through a current transformer whereby an AC signal is derived from the magnetic field induced by the AC current flow in the distribution line. The AC signal is converted to DC as part of the power harvesting process and used to power the monitoring sensors and associated electronics. This is typically referred to as "inductive harvesting using current transformers."

One method of mounting the current transformer on the distribution line is to cut the C.T. in two, mount the halves around the uncut distribution line, and mechanically hold the two C.T. halves together. The changing magnetic field (AC) causes the magnetic force of attraction between halves of a split core current transformer to alternate between a zero force and a peak force at twice the AC line frequency. During operation, the core halves need to be mechanically held together, which can be challenging in a hot-stick deployed sensor application.

SUMMARY OF THE DISCLOSURE

A method of monitoring a power grid distribution network is provided, comprising harvesting energy from a conductor line of the power grid distribution network with a split-core transformer of a monitoring device installed on the conductor line, powering the monitoring device with the harvested energy, and applying a DC bias to the split-core transformer to maintain a net positive magnetic force between first and second core halves of the split-core transformer.

In some embodiments, the magnetic force between the first and second core halves never equals zero during a full AC cycle on the conductor line.

In other embodiments, the method further comprises producing the DC bias with a circuit disposed within the monitoring device. In one embodiment, the circuit enables secondary currents flowing in secondary windings of the split-core transformer to have different magnitudes on each half-cycle of the AC cycle.

Another embodiment comprises sensing electrical parameters of the power grid distribution network with the monitoring device.

Another method of monitoring a power grid distribution network is provided, comprising installing a split-core transformer of a monitoring device around a conductor line of the power grid distribution network, the split-core transformer having a first core half and a second core half, harvesting energy from the conductor line with the split-core transformer, and during the harvesting energy step, applying a DC bias to the split-core transformer to maintain a net positive magnetic force between the first and second core halves of the split-core transformer.

In some embodiments, the magnetic force between the first and second core halves never equals zero during a full AC cycle on the conductor line.

In other embodiments, the method further comprises producing the DC bias with a circuit disposed within the monitoring device. In one embodiment, the circuit enables secondary currents flowing in secondary windings of the split-core transformer to have different magnitudes on each half-cycle of the AC cycle.

Another embodiment comprises sensing electrical parameters of the power grid distribution network with the monitoring device.

A power line monitoring device is also provided, comprising a split-core current transformer comprising first and second core halves, the split-core transformer being configured to harvest energy from a conductor line of a power grid distribution network to power the power line monitoring device, secondary windings disposed around at least the first core half of the split-core transformer, and a circuit electrically coupled to the secondary windings, the circuit configured to apply a DC bias to the secondary windings to maintain a net positive magnetic force between the first and second core halves.

In some embodiments, the device further comprises sensing elements configured to monitor electrical and environmental parameters of the power grid distribution network.

In some embodiments, the circuit is configured to produce secondary currents in the secondary windings that have different magnitudes on each half cycle of an AC line current of the conductor line.

BRIEF DESCRIPTION OF THE DRAWINGS

The novel features of the invention are set forth with particularity in the claims that follow. A better understanding of the features and advantages of the present invention will be obtained by reference to the following detailed description that sets forth illustrative embodiments, in which the principles of the invention are utilized, and the accompanying drawings of which:

DETAILED DESCRIPTION

Figure 1A:
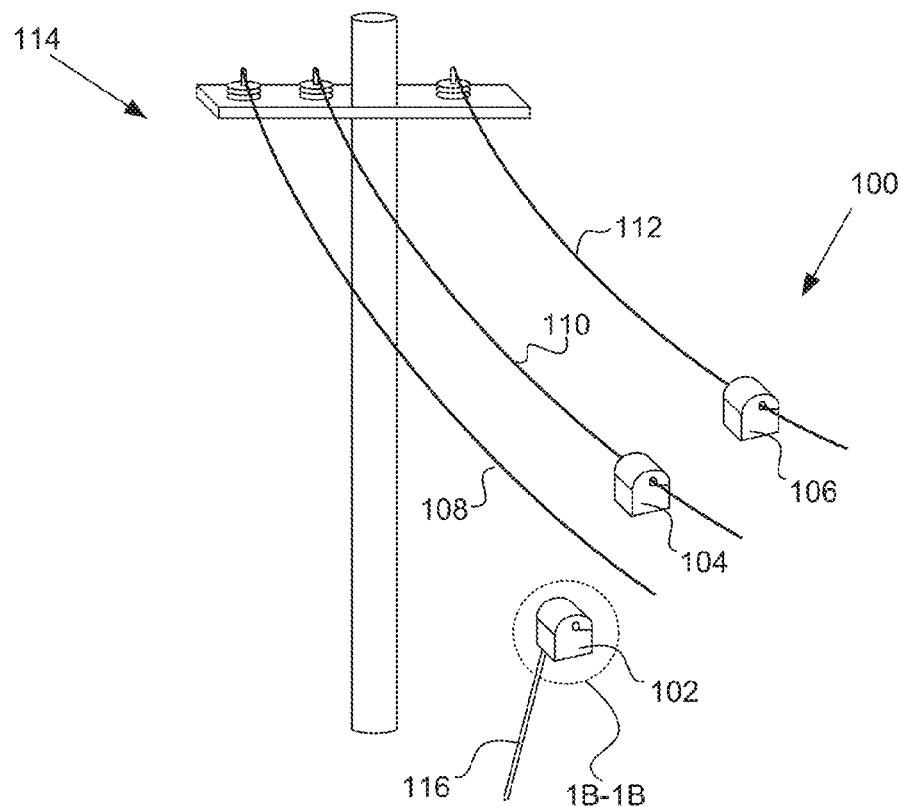
FIG. 1A is a typical over-head three-phase power distribution system utilizing a cross-bar mounted on pole for mechanical positioning of the conductors. Alternate patterns of parallel conductor routing are sometimes used. Power distribution line monitoring devices (102,104,106) are attached to the power lines typically using a standard lineman's shotgun hotstick (106) for easy deployment with necessitating turning off power in the lines.

Power line monitoring devices and systems described herein are configured to measure the currents and voltages of power grid distribution networks. Referring to FIG. 1A, monitoring system 100 comprises monitoring devices 102, 104, and 106 mounted to power lines 108, 110, and 112, respectively, of power distribution network 114. The power distribution network can be a three phase AC network, or alternatively, a single-phase network, for example. The power distribution network can be any type of network, such as a 60 Hz North American network, or alternatively, a 50 Hz network such as is found in Europe and Asia, for example. Power distribution networks, such as in the United States, typically operate at a medium voltage (e.g., 4 kV to 46 kV or higher) to reduce the energy lost during transmission over long distances. The monitoring devices can also be used on high voltage "transmission lines" that operate at voltages higher than 46 kV.

Figure 1B:
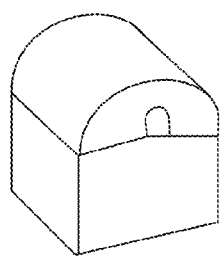
FIGS. 1B and 1C show a schematic representation of a monitoring sensor in the closed (1B) and open (1C) positions. The open position facilitates mounting the monitoring sensor on a power line. The sensor remains on the power line in the closed (1B) position.
Figure 1C:
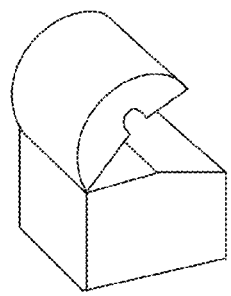

Monitoring devices 102, 104, and 106 can be mounted on each power line of a three-phase network, as shown, and can be configured to monitor, among other things, current flow in the power line and current waveforms, conductor temperatures, ambient temperatures, vibration, wind speed and monitoring device system diagnostics. In some embodiments, a fourth sensor can be mounted on the ground line near the three phase lines. In additional embodiments, multiple sensors can be used on a single phase line. The monitoring devices can be mounted quickly and easily via a hot-stick 116, and can harvest energy from the power lines for operation with or without additional supplemental power (e.g., include batteries or solar panels). The monitoring devices can further include wireless transmission and receiving capabilities for communication with a central server and for communications between each monitoring device. Installation of a three monitoring device array can be placed and configured by a single linesman with a hot-stick and a bucket truck in less than 20 minutes. Monitoring device communication with the installation crew can be enabled during the installation process to provide immediate verification of successful installation. FIG. 1B illustrates a monitoring device in a closed/clamped configuration, and FIG. 1C shows the monitoring device in an opened/installation configuration. It should be understood that the device is opened into the installation configuration during installation on power lines, then closed around the line in the clamped configuration prior to operation.

Furthermore, monitoring devices 102, 104, and 106 are configured to measure the electric field surrounding the power lines, to record and analyze event/fault signatures, and to classify event waveforms. Current and electric field waveform signatures can be monitored and catalogued by the monitoring devices to build a comprehensive database of events, causes, and remedial actions. In some embodiments, an application executed on a central server can provide waveform and event signature cataloguing and profiling for access by the monitoring devices and by utility companies. This system can provide fault localization information with remedial action recommendations to utility companies, pre-emptive equipment failure alerts, and assist in power quality management of the distribution grid.

Monitoring devices 102, 104, and 106 can comprise sensing elements, a power supply, a battery, a microprocessor board, and high powered communication systems (not shown) disposed within a robust mechanical housing designed for severe service conditions. The monitoring devices are configured to withstand temperatures ranging from −40 to +85 C., EMI and ESD immunity, current and voltage impulse resistance, driving rain and precipitation and salt fog survival. A typical embodiment of the monitoring devices is configured to operate continuously on power lines carrying up to 800 $A_{RMS}$ operating current with full functionality. Full functionality is also maintained during line fault current events up to 10 $kA_{RMS}$ and of limited time duration.

The monitoring devices can be configured to communicate wirelessly through a distribution network, such as through the Silver Spring Network, to the power utilities sensor control and distribution automation (SCADA) system. In some embodiments, the monitoring devices operate at 1 watt with a custom designed omni-directional antenna. When mounted to typical power grid distribution networks, the monitoring devices are located approximately 30 feet above ground level and typically above tree tops, providing for a very substantial effective range of communication. In addition to two-way network communications for data packets and setting operational setpoints, the monitoring devices can be configured for wireless device firmware upgrades for long term functionality.

Figure 2A:
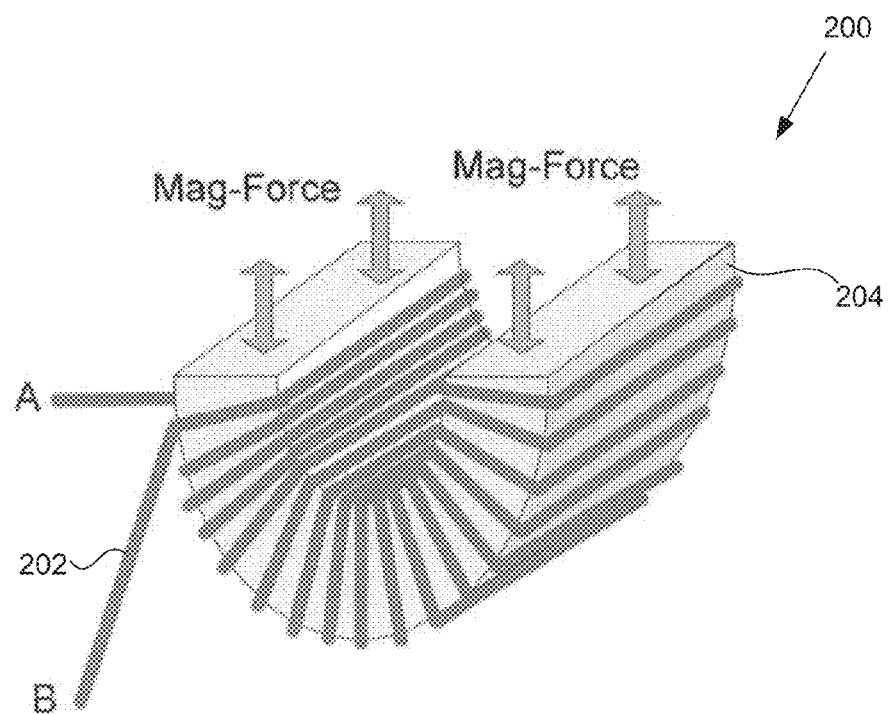
FIG. 2A is a schematic representation of the lower half of a power harvesting current transformer with ferromagnetic core 204 and turns of wire 202 (insulated copper wire is typical).
Figure 2B:
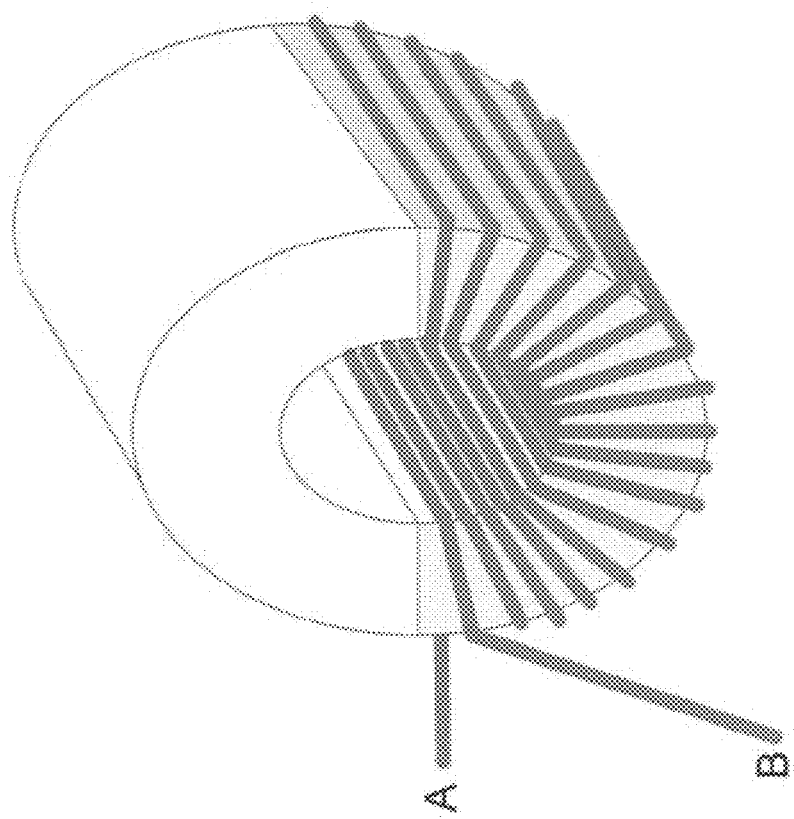
FIG. 2B shows the upper half of the power harvesting current transformer positioned above the lower half in what would be the closed position for normal operation. The upper and lower core halves separate with the mechanics of the housing to facilitate mounting the core on a power line.

The monitoring devices described herein can also include power harvesting systems configured to convert the changing magnetic field surrounding the distribution lines into current and/or voltage that can be rectified into DC current and used to power the monitoring devices. FIGS. 2A-2B illustrate one embodiment of a power harvesting system 200, which can be included in the monitoring devices 102, 104, and 106 of FIGS. 1A-1C. In some embodiments, the power harvesting system is positioned in the monitoring devices so as to surround the power lines when the monitoring devices are installed.

Referring to FIG. 2A, power harvesting system 200 can include harvesting core secondary windings 202 around a first half 204 of a split core current transformer. The current induced in the harvesting core secondary windings can be consumed in an asymmetrical manner regarding the phase and thus produce a net DC biased load current. The DC biased current in the harvesting core windings directly produces a bias in the magnetic flux density that in turn makes a net bias in the attractive magnetic force between the core halves. The bias in the load current can be made high enough to maintain a net positive magnetic force (shown as Mag-Force in FIG. 2A) on the core halves even as the AC line current continues to produce an oscillatory magnetic flux. The DC bias current scheme can be implemented using active non-linear circuitry of any of a type of analog, mixed analog and digital, or microprocessor-based type, some form of energy storage in the circuitry of the monitoring device, such as a battery, capacitor, inductor, etc. Holding the core halves together with a magnetic force advantageously relieves the amount of mechanical force required to hold the core halves together.

The DC bias induced in the core winding is nominally continuous such that some net force of attraction is always induced between the core halves. The power line induced AC component will create a time varying force that is cyclically greater than or equal to the DC bias induced force. Maintaining some amount of DC bias force substantially reduces or eliminates the core vibrational noise, keeps the core faces held in contact to reduce slippage, and avoids the generation of inter-gap particulate from the core faces chattering together. The DC bias current necessary to provide these benefits is a function of the number of winding turns, operating current range of the line current, and other factors. A DC bias current of single digit milliamperes to several hundred milliamperes can be used, for example.

As described above, in a conventional system without a DC bias, the changing magnetic field (AC) on the power lines can cause the magnetic force of attraction between halves of a split core current transformer to alternate between a zero force and a peak force at twice the AC line frequency. FIG. 2B illustrates the second half 206 of the split core current transformer being held in place against the first half 204 with the magnetic force induced by the DC bias. The core halves 202 and 204 are forcefully attracted together by the magnetic field in the core halves. A DC bias current imposed on the core winding wires (A-B) can keep the magnetic force in a net-positive direction so that the halves are always being forced together.

Figure 3A:
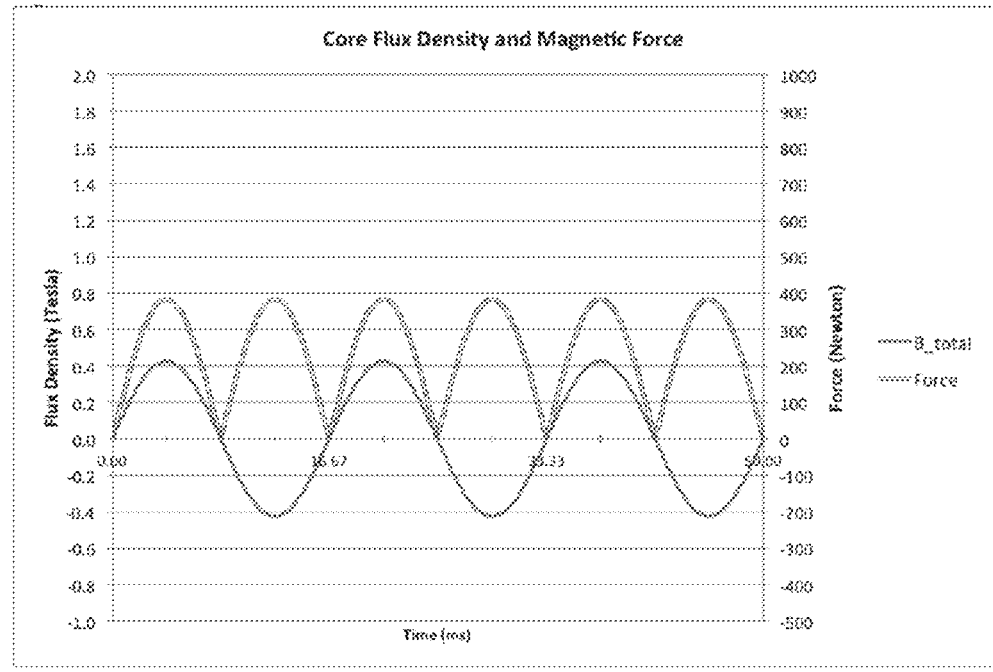
FIG. 3A is a time graph of the magnetic force (two lines) between each face of the upper and lower permeable core halves resulting from the induced magnetic flux (one line) by the power line current and the AC currents flowing in the winding wire.

Applying a DC bias to the core windings can have the further benefit of reducing vibration noise caused by the energy harvesting system. Without a DC bias, the magnetic force between core halves goes to zero on each half cycle (e.g., 120 times per second on a 60 Hz line, as shown in FIG. 3A). The magnetostriction of the core material and the mechanics of the design can cause mechanical energy storage as compression displacement due to the magnetic force field. This energy can be released when the magnetic field or flux goes near zero and the magnetostriction force likewise goes to near zero force. The core halves relax and may mechanically separate from another slightly. This relaxation and separation can be brought back together on the next half cycle of the AC current, creating an audible sound that manifests as a 120 Hz buzzing noise. Thus, in some embodiments, applying a DC bias to one of the core halves can eliminate the periodic separation of the halves, thereby eliminating vibration noise in the monitoring devices when mounted on power lines.

Additionally, applying a DC bias to the core halves results in additional control gained for the removal of the monitoring devices from power lines. In a monitoring device without a DC bias, the removal process requires overcoming the magnetic attractive force to separate the core halves. This force can be substantial and require excessive mechanical design, adding cost and weight to the device. However, in one embodiment, the DC bias can be lowered to levels that allow for easy removal.

FIGS. 3A-3D illustrate the magnetic flux density in the core material of the split-core transformer resulting from the AC line current. The magnetic flux density is closely proportional to the line current as derived from Ampere's Law for magnetic fields up to the magnetic saturation level of the core material. For a toroidal shaped current transformer core the flux density B is closely approximated by where:

$$B = \mu_0 nI/L = \mu_0 nI/2\pi r$$

where:
"B" is the flux density, in Tesla
"$\mu_0$" is the permeability of space, equals $4\pi \times 10^{-7}$ T·m/A
"n" is the number of turns of winding wire, equals 1 for primary conductor
"I" is the current in the winding wire, in Amperes
"L" is the circumferential length of toroidal core centerline, in $m^2$
"r" is the centerline radius, in m The mechanical force between two nearby magnetized surfaces of area "A" can be calculated knowing the magnetic flux density "B" transecting the surfaces. In a split-core current transformer the total magnetic flux density in the core results from the superposition of the flux densities of the windings; the first being the single-turn primary line conductor, the second being the energy harvesting secondary winding. The net magnetic force between the split-core halves at the cut faces can be calculated with the following equation. The equation is for cases in which the effect of magnetic flux fringing is negligible and the volume of the air gap is much smaller than that of the magnetized core material.

$$\text{Force} = (\mu 0 H2A)/2$$

$$= B2A/(2\mu_0)$$

Where:
"A" is the area of each cut core surface, in $m^2$
"H" is the magnetizing field, in A/m.

Figure 3B:
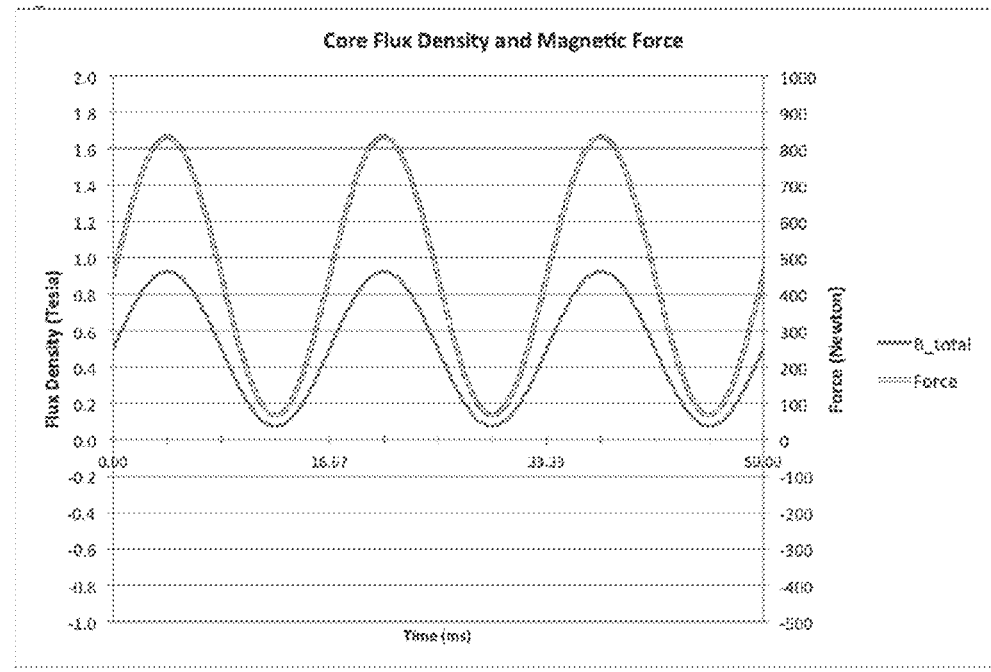
FIG. 3B is a time graph of the magnetic force (two lines) between each face of the upper and lower permeable core halves resulting from the induced magnetic flux (one line) by the power line current and the AC and DC currents flowing in the winding wire. The DC component of the current flowing in the winding wire causes an asymmetrical attractive force in the core halves.
Figure 3C:
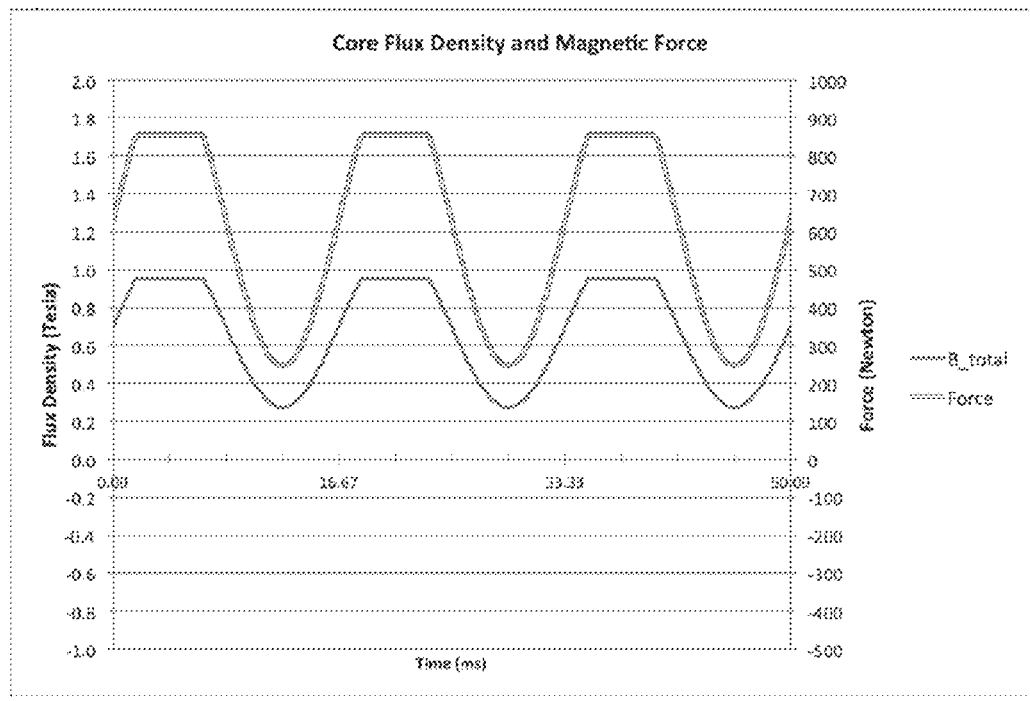
FIG. 3C is a time graph of the magnetic force (two lines) between each face of the upper and lower permeable core halves resulting from the induced magnetic flux (one line) by the power line current and the AC and DC currents flowing in the winding wire. The DC component of the current flowing in the winding wire causes an asymmetrical attractive force in the core halves. The DC component raises the flux density high enough that the magnetic flux density saturation level of the material is reached and the flux density and force can raise no further.

FIG. 3A illustrates the magnetic flux density and magnetic force in a split core current transformer resulting from 60 Hz line current. FIG. 3B illustrates the magnetic force in a split core current transformer resulting from line current plus DC bias imposed on the secondary harvest output winding. As shown in FIG. 3A, the magnetic force in a traditional split core current transformer power harvesting design goes to zero as the current on the conductor transitions from positive to negative and negative to positive. In contrast, in FIG. 3B, applying a DC bias to the split core current transformer results in a corresponding bias in the magnetic flux density causing there to always be a positive magnetic force across the transformer gaps, even as the alternating current transitions from positive to negative. FIG. 3C illustrates the flux density reaching the core material's maximum saturation flux density of 1.7 Tesla and the magnetic force limiting incurred by the flux saturation.

Figure 3D:
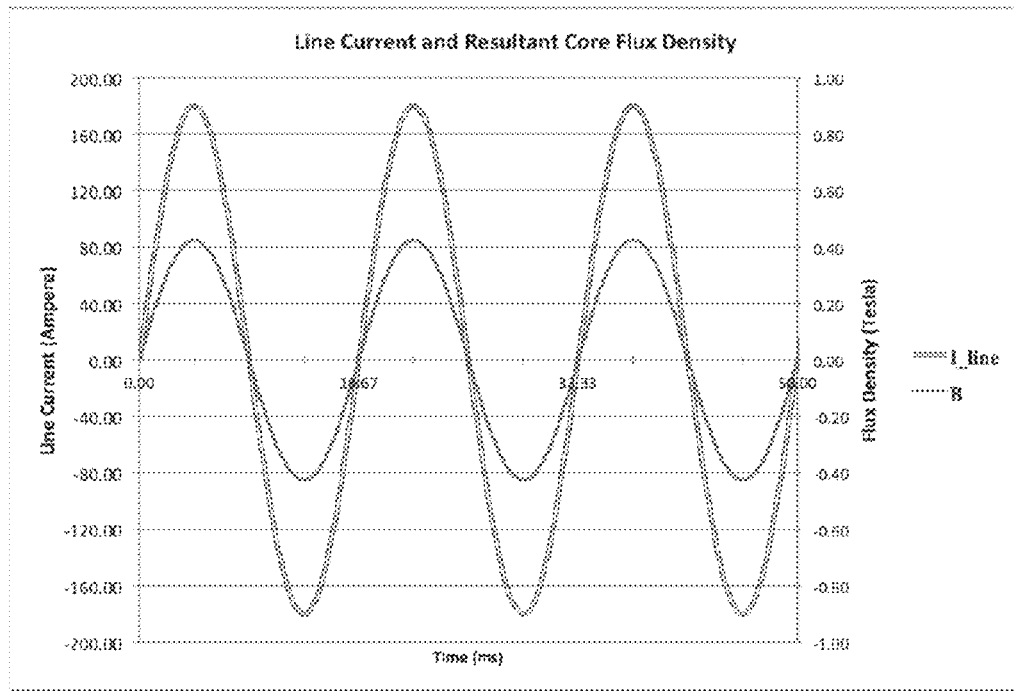
FIG. 3D illustrates the line current and the resultant core flux density.

FIG. 3D illustrates the line current and the resultant core flux density.

Figure 4:
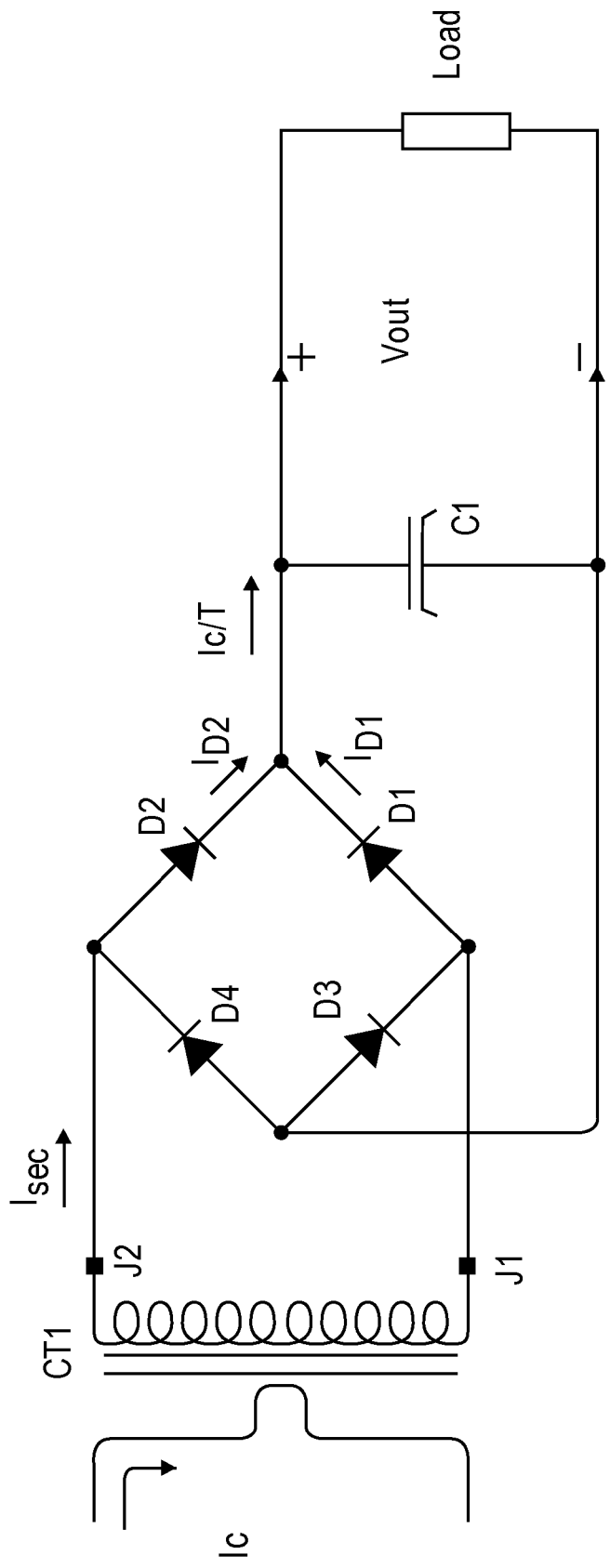
FIG. 4 shows a configuration for energy harvesting using a split-core current transformer and an AC-to-DC convertor using a rectifier bridge circuit and capacitor.

Referring to FIG. 4, one embodiment to harvest energy from the magnetic field generated by current flow in a distribution line conductor is to use a split-core current transformer CT1. The primary side of CT1 is the single distribution line conductor passing through the core. The secondary side of CT1 is formed by turns of a smaller gauge wire wound onto the CT core usually with many turns; number of turns being anywhere from one to thousands depending on the application with 100 to 1000 being a common range. An alternating current (AC) flowing in the primary conductor establishes an alternating magnetic flux in the permeable core material. The mutual coupling of the core to the secondary winding establishes a current flow in the secondary. The current flowing in the secondary is proportional to the current in the primary with the proportionality coefficient equal to the ratio of primary turns to secondary turns. The energy that can be transferred from primary current to secondary current is limited in amount by the limited permeability of the core material. Generally a core material with high permeability is selected for this application to maximize the amount of energy transferrable. When the core reaches its maximum magnetic flux density, called saturation, the transfer mechanism ceases to operate and no more energy will transfer until the core is unsaturated. This unsaturation can happen when the primary current reverses direction or ceases flowing.

The magnetic flux density in the permeable split-core establishes an attractive force between the core halves at the adjoining faces at each split. The force generated across the gap is attractive for each half cycle of alternating current. Those in the industry commonly understand this property. While on each half cycle there is an attractive force when the magnetic flux is established, there is also two moments per cycle when the magnetic flux density in the core is equal to zero. These two points occur when the magnetic flux is in transition from one direction to the other. An undesirable consequence of these zero-level magnetic flux densities is that a mechanical relaxation occurs when the attractive force goes to zero resulting in audible hum or buzz in CT1 assembly. The audible noise is roughly proportional to the magnitude of the current flowing in the primary; more primary current generally results in more audible noise. Audible noise is an undesirable side effect of the harvesting process.

Generally a high force is applied by external means in an attempt to overcome the magnetic relaxation forces and thus prevent audible noise. However, in a distribution grid power harvesting application where the device is installed using the utility industry standard hot-stick, there is great difficulty in designing a mechanism to apply the necessary mechanical force at reasonable cost and weight.

The full-wave bridge rectifier circuit formed by rectifiers D1-D4 and capacitor C1 can be used to create a DC voltage from the AC current flowing in the secondary windings. The DC voltage is established on capacitor C1 and can used to power measurement and communications circuits and systems of the monitoring devices described above.

A brief description of the circuit operation of FIG. 4 is given. AC current flow, Ic, in the primary of CT1 transfers an alternating current into the secondary winding of CT1 by the mutual inductance of the split high permeability core. During one half cycle of primary current Ic, flowing in the direction of the arrow shown, develops current Ict1 in the secondary, in one particular direction (for example as shown by arrow). The secondary current Isec travels from J2 through rectifier D2, capacitor C1 and load, rectifier D3, and back through secondary winding of CT1 at J1.

During the second half-cycle of the primary current, when the primary current flows in the reverse direction to the arrow shown, the secondary current Isec flows from J1 through rectifier D1, capacitor C1 and load, rectifier D4, and back through secondary winding CT1 at J2. In this way both the positive and negative half cycles of line current Ic produce the same direct current direction through the load and output capacitor C1. This is the commonly understood principle of the full-wave rectifier circuit.

A key point of the basic full-wave rectifier circuit is that the magnitudes of the currents flowing in CT1 secondary during each half cycle are the same. There is no distinction by the load or output capacitor C1 whether the secondary current is flowing in the positive or negative direction. As the net magnetic flux produced by CT1 primary and secondary currents alternates from positive to negative, and negative to positive, there results in two points in each cycle where the magnetic flux density in CT1 is zero. The two points at which the magnetic flux is zero results in two moments of zero magnetic force between the core halves.

Those that practice power supply design will recognize the over-simplification of the design to highlight the architecture of the circuit. Other circuit components are typically included to reduce electromagnetic interference (EMI), provide over-current and over-voltage protection, connect electrical elements together and support heat dissipation. Rectifiers can be one or a combination of several types including, but not exclusive of others, silicon PN junction diodes, Schottky diodes, MOSFETs or bipolar transistors actively driven, etc. Energy storage for operating circuits can be accomplished by capacitors, batteries, super-capacitors, etc.

Figure 5:
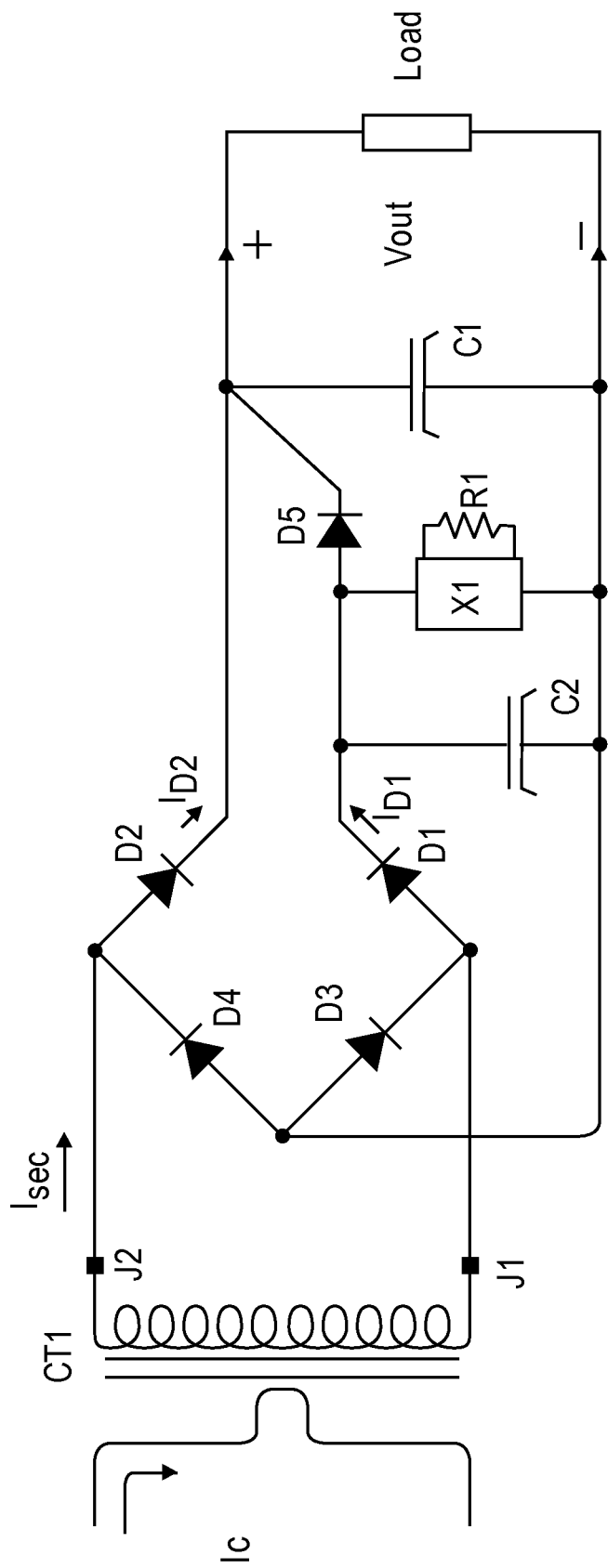
FIG. 5 illustrates a configuration for energy harvesting and AC-to-DC conversion using a saturable reactor circuit architecture to generate a net attractive force on the split-core current transformer.

Referring to FIG. 5, the basic full-wave rectifier circuit is modified to enable the secondary currents Isec to have different magnitudes on each half cycle of the line current. The result of enabling the secondary currents to have different magnitudes on each half cycle of the line current is that there no longer exists two points during each cycle where the magnetic flux is zero, and therefore, there are no longer moments of zero magnetic force between the core halves. One method of accomplishing this is by breaking the rectifier bridge circuit at cathodes of D2 and D1 and adding additional circuit elements C2, circuit block X1, R1, and D5. Circuit block X1 can be derived from active components and powered from energy stored on C2, C1, or on a battery or super-capacitor charged from the rectifier circuit. Thus, the circuit shown in FIG. 5 can be implemented in a power line sensor described herein to provide a DC bias to the split-core transformer to maintain a net positive or attractive magnetic force between the first and second core halves of the split-core transformer.

The capacitor C1 in FIGS. 4 and 5 can be the energy storage element. C1 will charge up and hold voltage on each half cycle of the line current. This voltage can then used to power circuits (measurements, communication radio, etc) within the power line sensor. The special circuit X1 added in FIG. 5 can be powered from the energy stored in C1 or in C2 (as shown). Circuit X1 is responsible for creating the DC bias current in the secondary winding. Without circuit X1 (as in FIG. 4) the current in secondary winding is the same magnitude for a positive half-cycle and a negative half-cycle, just opposite direction. To change direction means the current had to pass thru zero (+ to 0 to − to zero to + . . . etc).

As for additional details pertinent to the present invention, materials and manufacturing techniques may be employed as within the level of those with skill in the relevant art. The same may hold true with respect to method-based aspects of the invention in terms of additional acts commonly or logically employed. Also, it is contemplated that any optional feature of the inventive variations described may be set forth and claimed independently, or in combination with any one or more of the features described herein. Likewise, reference to a singular item, includes the possibility that there are plural of the same items present. More specifically, as used herein and in the appended claims, the singular forms "a," "and," "said," and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Unless defined otherwise herein, all technical and scientific terms used herein have the same meaning as commonly understood by one of ordinary skill in the art to which this invention belongs. The breadth of the present invention is not to be limited by the subject specification, but rather only by the plain meaning of the claim terms employed.

What is claimed is:

1. A method of monitoring a power grid distribution network, comprising the steps of:
    harvesting energy from a conductor line of the power grid distribution network with a split-core transformer of a monitoring device installed on the conductor line;
    powering the monitoring device with the harvested energy; and
    applying a DC bias to the split-core transformer to maintain a net positive magnetic force between first and second core halves of the split-core transformer.

2. The method of claim 1 wherein the magnetic force between the first and second core halves never equals zero during a full AC cycle on the conductor line.

3. The method of claim 2 further comprising producing the DC bias with a circuit disposed within the monitoring device.

4. The method of claim 3 wherein the circuit enables secondary currents flowing in secondary windings of the split-core transformer to have different magnitudes on each half-cycle of the AC cycle.

5. The method of claim 1 further comprising sensing electrical parameters of the power grid distribution network with the monitoring device.

6. A method of monitoring a power grid distribution network, comprising the steps of:
    installing a split-core transformer of a monitoring device around a conductor line of the power grid distribution network, the split-core transformer having a first core half and a second core half;
    harvesting energy from the conductor line with the split-core transformer; and
    during the harvesting energy step, applying a DC bias to the split-core transformer to maintain a net positive magnetic force between the first and second core halves of the split-core transformer.

7. The method of claim 6 wherein the magnetic force between the first and second core halves never equals zero during a full AC cycle on the conductor line.

8. The method of claim 7 further comprising producing the DC bias with a circuit disposed within the monitoring device.

9. The method of claim 8 wherein the circuit enables secondary currents flowing in secondary windings of the split-core transformer to have different magnitudes on each half-cycle of the AC cycle.

10. The method of claim 6 wherein the power grid distribution network comprises an AC power grid distribution network.

11. The method of claim 6 further comprising sensing electrical parameters of the power grid distribution network with the monitoring device.

12. A power line monitoring device, comprising:
    a split-core current transformer comprising first and second core halves, the split-core transformer being configured to harvest energy from a conductor line of a power grid distribution network to power the power line monitoring device;
    secondary windings disposed around at least the first core half of the split-core transformer; and
    a circuit electrically coupled to the secondary windings, the circuit configured to apply a DC bias to the secondary windings to maintain a net positive magnetic force between the first and second core halves.

13. The device of claim 12 further comprising sensing elements configured to monitor electrical and environmental parameters of the power grid distribution network.

14. The device of claim 12 wherein the circuit is configured to produce secondary currents in the secondary windings that have different magnitudes on each half cycle of an AC line current of the conductor line.

* * * * *